(12) United States Patent
Asao et al.

(10) Patent No.: US 11,147,199 B2
(45) Date of Patent: Oct. 12, 2021

(54) TAPE FEEDER

(71) Applicant: FUJI CORPORATION, Chiryu (JP)

(72) Inventors: Hidekazu Asao, Aso-mura (JP); Akira Hara, Toyohashi (JP); Toshiaki Kondo, Obu (JP)

(73) Assignee: FUJI CORPORATION, Chiryu (JP)

( * ) Notice: Subject to any disclaimer, the term of this patent is extended or adjusted under 35 U.S.C. 154(b) by 51 days.

(21) Appl. No.: 16/641,077

(22) PCT Filed: Sep. 1, 2017

(86) PCT No.: PCT/JP2017/031633
§ 371 (c)(1),
(2) Date: Feb. 21, 2020

(87) PCT Pub. No.: WO2019/043920
PCT Pub. Date: Mar. 7, 2019

(65) Prior Publication Data
US 2020/0178427 A1      Jun. 4, 2020

(51) Int. Cl.
*B23P 19/00*           (2006.01)
*H05K 13/00*           (2006.01)
(Continued)

(52) U.S. Cl.
CPC ......... *H05K 13/0015* (2013.01); *H05K 13/02* (2013.01); *H05K 13/0419* (2018.08); *H05K 13/08* (2013.01); *Y10T 29/53178* (2015.01)

(58) Field of Classification Search
CPC ........... H05K 13/0419; H05K 13/0417; H05K 13/0812; H05K 13/04; Y10T 29/53174;
(Continued)

(56) References Cited

U.S. PATENT DOCUMENTS

| | | | | |
|---|---|---|---|---|
| 8,875,383 | B2* | 11/2014 | Ohno | H05K 13/0419 29/703 |
| 10,172,270 | B2* | 1/2019 | Youngquist | H05K 13/0419 |
| 2005/0096781 | A1 | 5/2005 | Sumida et al. | |

FOREIGN PATENT DOCUMENTS

| | | |
|---|---|---|
| JP | 2009-239253 A | 10/2009 |
| JP | 2010-93297 A | 4/2010 |

(Continued)

OTHER PUBLICATIONS

International Search Report dated Nov. 21, 2017 in PCT/JP2017/031633 filed Sep. 1, 2017, 2 pages.

(Continued)

*Primary Examiner* — Thiem D Phan
(74) *Attorney, Agent, or Firm* — Oblon, McClelland, Maier & Neustadt, L.L.P.

(57) ABSTRACT

A control device of the tape feeder includes: a step-out detecting section for detecting a step-out of a stepping motor; a memory section for storing a target angle of a sprocket for positioning one of multiple cavities at a supply section; and a restoration process section for performing origin alignment, when the step-out detecting section detects a step-out of the stepping motor, wherein pulse power is supplied to the stepping motor so that the sprocket reaches a predetermined angle, supplying the pulse power to the stepping motor in accordance with the current angle and the target angle of the sprocket after the origin alignment is completed, and moving one of the multiple cavities to the supply section.

8 Claims, 5 Drawing Sheets

(51) Int. Cl.
    *H05K 13/04* (2006.01)
    *H05K 13/02* (2006.01)
    *H05K 13/08* (2006.01)
(58) Field of Classification Search
    CPC ........... Y10T 29/53178; Y10T 29/4913; Y10T 29/53465; Y10T 29/53539
    USPC .......................... 29/740, 701, 703, 822, 823
    See application file for complete search history.

(56) References Cited

FOREIGN PATENT DOCUMENTS

| | | |
|---|---|---|
| JP | 2011-82500 A | 4/2011 |
| JP | 2011-228377 A | 11/2011 |
| JP | 2017-11316 A | 1/2017 |
| WO | WO 03/071847 A1 | 8/2003 |

OTHER PUBLICATIONS

Extended European Search Report dated Jul. 13, 2020 in corresponding European Patent Application No. 17923828.2, 9 pages.

* cited by examiner

Angle information M1

| Detection angle | Reference angle | | | | | | | | |
|---|---|---|---|---|---|---|---|---|---|
| | 0 | 3 | 6 | 9 | 12 | 15 | 18 | 21 | - - - |
| Engagement protrusion | R1 | R2 | R3 | R4 | R5 | R6 | R7 | R8 | - - - |

FIG. 7

TAPE FEEDER

TECHNICAL FIELD

The present application relates to a tape feeder.

BACKGROUND ART

Tape feeders are used in mounting processes by electronic component mounting machines, for example, as disclosed in Patent Literature 1. A tape feeder conveys a carrier tape storing electronic components by rotating a sprocket engaged with the carrier tape to supply the electronic components to an electronic component mounting machine. The tape feeder uses a stepping motor, which rotates in accordance with supplied pulse power, as a driving source for rotating the sprocket.

PATENT LITERATURE

Patent Literature 1: Japanese Patent Application Laid-Open No. 2017-011316

BRIEF SUMMARY

Technical Problem

In the tape feeder, the stepping motor may step out due to, for example, overloading of the carrier tape. In such a case, it is desirable to restore the tape feeder by conveying the carrier tape by a movement amount depending on the type of carrier tape, among various types of carrier tapes whose intervals between cavities are different from each other, so that the electronic component mounting machine can pick up electronic components from the tape feeder.

It is an object of the present specification to provide a tape feeder capable of restoring various types of carrier tapes when a step-out of the stepping motor occurs.

Solution to Problem

The present specification provides a tape feeder configured to supply an electronic component to an electronic component mounting machine by conveying a carrier tape having multiple cavities for accommodating electronic components at a predetermined interval in the conveyance direction and multiple engagement holes at a predetermined interval in the conveyance direction; the tape feeder comprising: a feeder main body having a supply section configured to supply the electronic components to the electronic component mounting machine; a sprocket, being rotatably provided in the feeder main body, with multiple engagement protrusions that are arranged at equal intervals in a circumferential direction and are configured to engage with the engagement holes; a stepping motor configured to rotate the sprocket in accordance with supplied pulse power; and a control device configured to supply pulse power to the stepping motor to control the conveyance of the carrier tape so as to position the multiple cavities sequentially at the supply section; and wherein the control device comprises: a step-out detecting section configured to detect a step-out of the stepping motor; a memory section configured to store a target angle of the sprocket for positioning one of the multiple cavities at the supply section, and a restoration process section configured to: perform origin alignment, when the step-out detecting section detects a step-out of the stepping motor, by supplying pulse power to the stepping motor so that the sprocket reaches a predetermined angle; supply pulse power to the stepping motor in accordance with the current angle and target angle of the sprocket after the origin alignment is completed, and move one of the multiple cavities to the supply section.

Advantageous Effects

With such a configuration, in the step-out restoration process, the tape feeder can execute the restoration process corresponding to each of the various types of carrier tapes having different intervals between respective cavities by using the current angle and the target angle after the origin alignment is completed. Then, the tape feeder can appropriately rotate the sprocket based on the current angle and the target angle to convey the carrier tape, and restore the component mounting machine so that electronic components can be picked up from the supply section.

DESCRIPTION OF EMBODIMENTS

1. Embodiment

1-1. Overview of Electronic Component Mounting Machine 10

Figure 1:
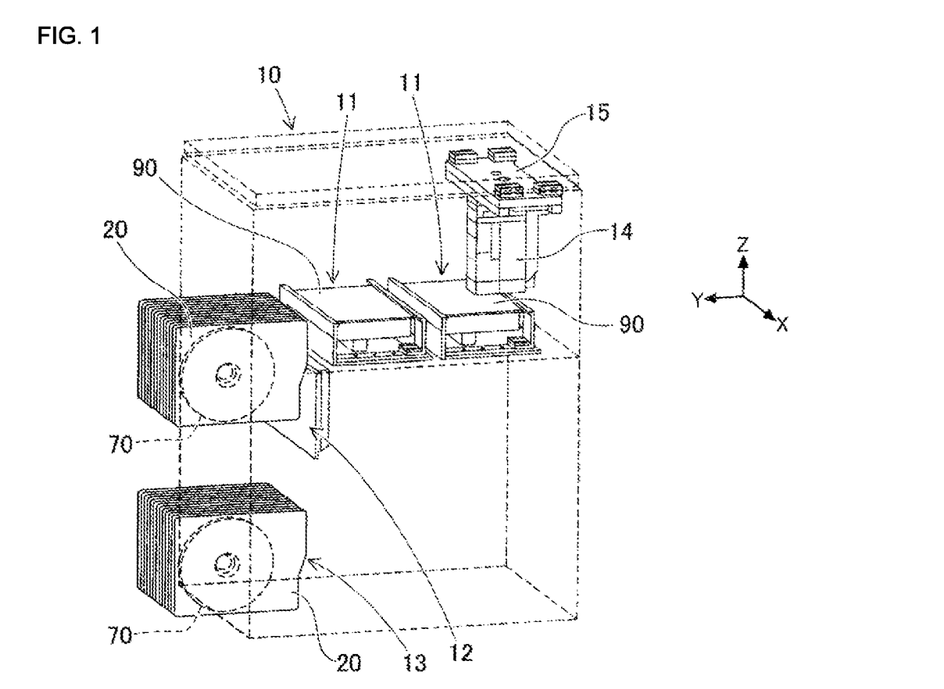
FIG. 1 A simplified perspective view of an electronic component mounting machine configuration.

Electronic component mounting machine 10 mounts an electronic component to circuit board 90 using tape feeder 20. Hereinafter, the electronic component mounting machine is referred to as a "component mounting machine", the tape feeder is referred to as a "feeder", the circuit board is referred to as a "board", and the electronic component is referred to as a "component". As shown in FIG. 1, component mounting machine 10 includes board conveyance device 11, upper slot 12, lower slot 13, mounting head 14, and head moving device 15. Board conveyance device 11 conveys board 90 into component mounting machine 10 and positions board 90 at a predetermined position. In addition, after the mounting process by component mounting machine 10 is executed, board conveyance device 11 conveys board 90 out of component mounting machine 10.

Upper slot 12 is disposed at the upper-front part of component mounting machine 10. Upper slot 12 holds feeder 20 in an operable manner. The operation of feeder 20 set in upper slot 12 is controlled in the mounting process by component mounting machine 10, and a component is supplied by supply section 211 (refer to FIG. 2) provided at a defined position on the upper portion of feeder 20.

Lower slot 13 is disposed below upper slot 12. Lower slot 13 stocks feeders 20 to be used for the mounting process by component mounting machine 10 or used feeders 20 used in the mounting process. The exchange of feeders 20 between upper slot 12 and lower slot 13 is performed by automatic exchanging by an exchanging robot (not shown) or manual exchanging by an operator.

Mounting head 14 is provided with a suction nozzle (not shown) for picking up components supplied by feeder 20. The suction nozzle is supplied with negative pressure air to pick up components. Instead of the suction nozzle, mounting head 14 can be attached with a chuck or the like, for gripping components, corresponding to the target component to be held. Mounting head 14 holds the suction nozzle in a manner which allows movement in the up-down direction and allows rotation about a vertical axis. Head moving device 15 moves mounting head 14 in the horizontal direction by, for example, a linear motion mechanism.

Component mounting machine 10 having the above-described configuration appropriately controls the operations of mounting head 14, head moving device 15, and feeder 20 during the mounting process. As a result, component mounting machine 10 picks up components supplied by feeder 20, mounts the components at predetermined positions on board 90, and produces various board products.

1-2. Feeder 20 Configuration

Figure 2:
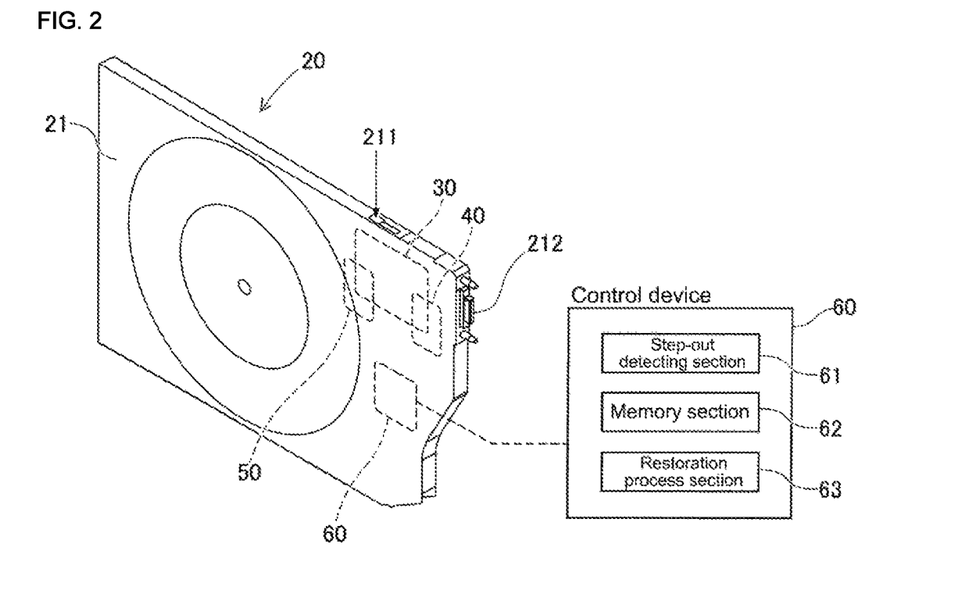
FIG. 2 A perspective view showing the appearance and functional blocks of a tape feeder.

The configuration of feeder 20 will be described with reference to FIGS. 2 to 6. Feeder 20 includes feeder main body 21, driving device 30, angle sensor 40, detection sensor 50, and control device 60. As shown in FIG. 2, feeder main body 21 has a flat-box shape. Feeder main body 21 has supply section 211 for supplying a component to component mounting machine 10. Supply section 211 is on the upper part of the front side of feeder main body 21 (lower-right side of FIG. 2).

Figure 3:
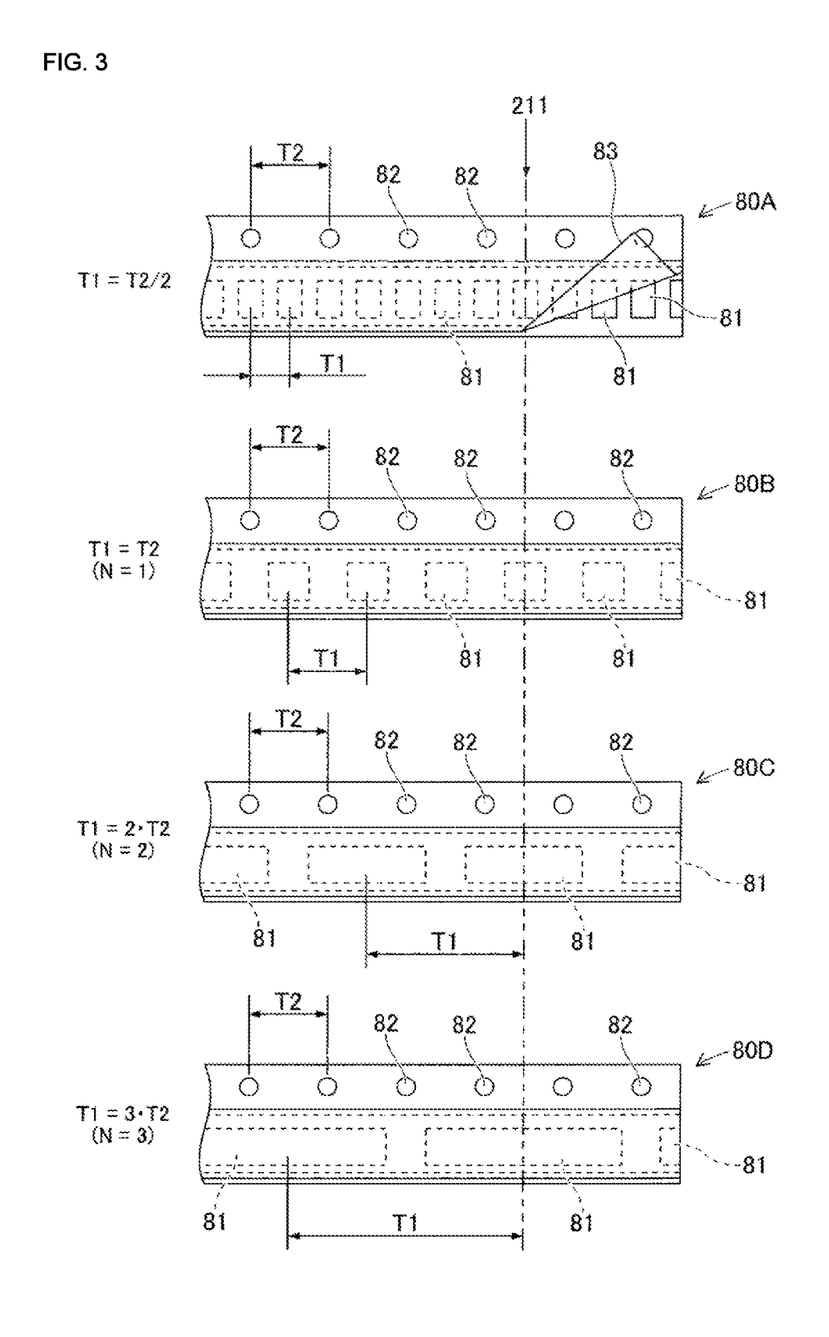
FIG. 3 Partial top views showing multiple types of carrier tapes.

Feeder main body 21 holds tape reel 70 on which carrier tape 80 is wound in a detachable (i.e., exchangeable) manner. Tape reel 70 is rotatably supported by feeder main body 21. As shown in FIG. 3, carrier tape 80 has multiple cavities 81 for accommodating components and multiple engagement holes 82 at predetermined intervals in the conveyance direction.

Cover tape 83 is adhered to the upper surface of carrier tape 80, closing the openings of cavities 81. Cover tape 83 is peeled off from a portion of carrier tape 80 conveyed to supply section 211 so that mounting head 14 can pick up components. In other words, feeder 20 positions one of the multiple cavities 81 of carrier tape 80 to supply section 211, making it possible to supply a component accommodated in cavity 81 in a manner which allows components to be picked up. Hereinafter, the carrier tape is referred to as "tape".

Figure 6:
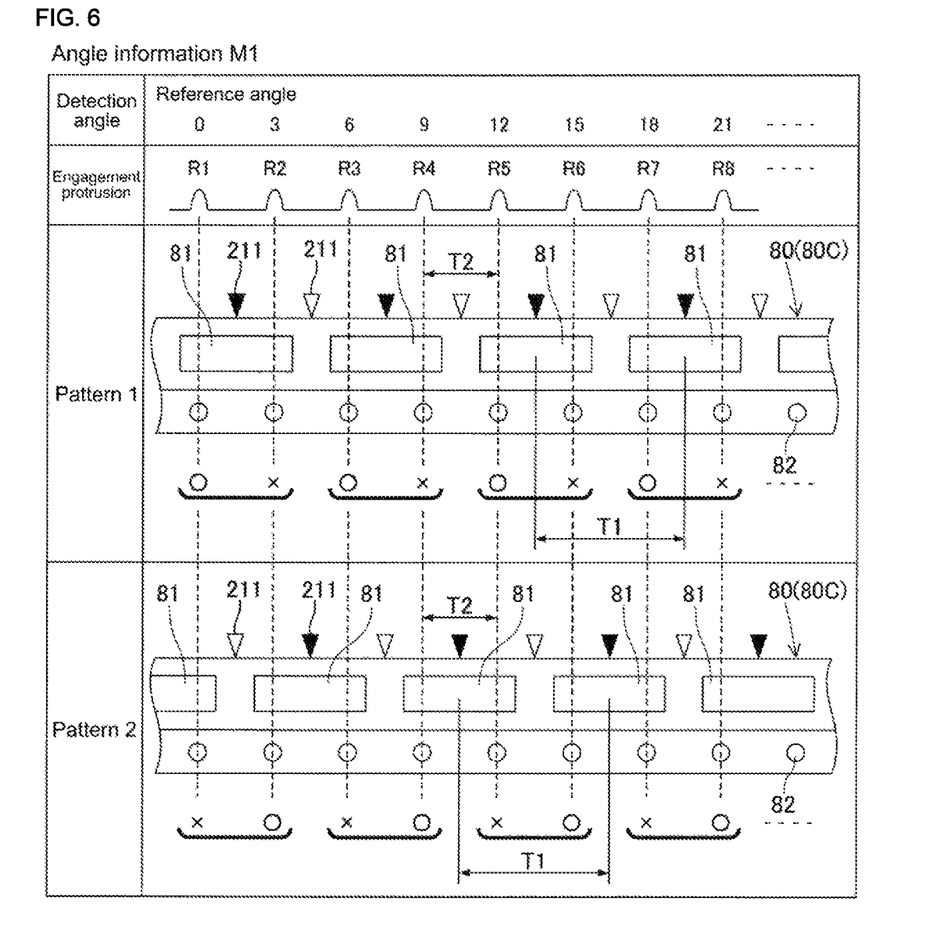
FIG. 6 A diagram of angle information showing the relationship between the angles of a cavity and a sprocket.

The multiple cavities 81 are formed at predetermined intervals in the conveyance direction, similarly to the multiple engagement holes 82. The interval T1 between cavities 81 is appropriately set in accordance with the dimensions of the components to be accommodated. For example, as shown in FIG. 3, the interval T1 of cavities 81 is set to half the interval T2 of engagement holes 82 (T1=T2/2), or set to an integer multiple of the interval T2 of engagement holes 82 (T1=N·T2, where N is an integer of 1 or more), or the like. Note that FIG. 6 shows tape 80 in which the interval T1 between cavities 81 is set to twice the interval T2 between engagement holes 82, in the same way as tape 80C of the third carrier tape example from the top in FIG. 3.

Figure 4:
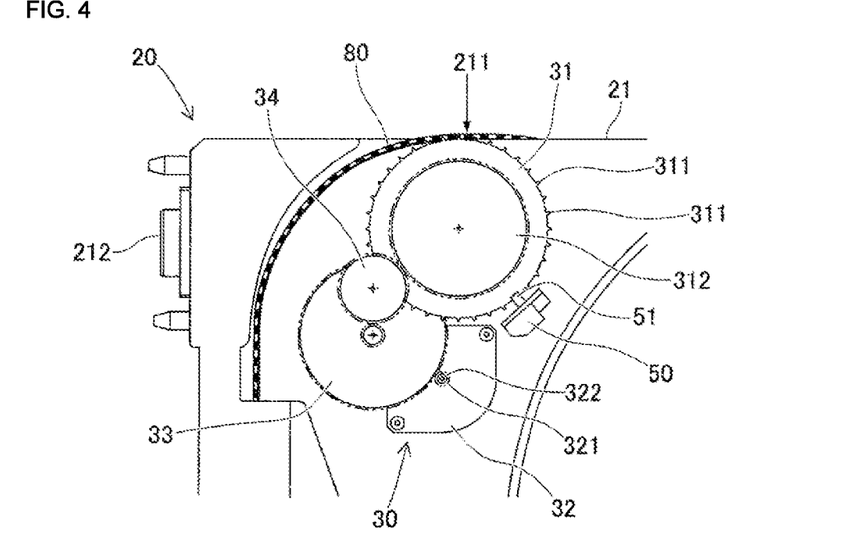
FIG. 4 A side view schematically showing a configuration of a driving device and a control device of the tape feeder.

As shown in FIG. 4, driving device 30 includes sprocket 31 rotatably supported by feeder main body 21. Sprocket 31 is disposed with engagement protrusions 311 that can engage with engagement holes 82 of tape 80 at equal intervals in the circumferential direction. In the present embodiment, supply section 211 of feeder main body 21 is set at a position shifted from the rotation center of sprocket 31 in the conveyance direction of tape 80 by a distance which is half the distance T2 between engagement holes 82 of tape 80. Driving device 30 includes stepping motor 32 as a driving source for rotating sprocket 31. Stepping motor 32 rotates sprocket 31 in accordance with supplied pulse power.

Specifically, when rotation axis 321 of stepping motor 32 rotates, reduction gear 33 rotates, reduction gear 33 being engaged with drive gear 322 provided on rotation axis 321. The driving force outputted by stepping motor 32 is transmitted to sprocket 31 via intermediate gear 34, intermediate gear 34 being engaged with reduction gear 33. Intermediate gear 34 engages with sprocket gear 312 provided on sprocket 31. As a result, sprocket 31 rotates with the rotation of intermediate gear 34.

Figure 5:
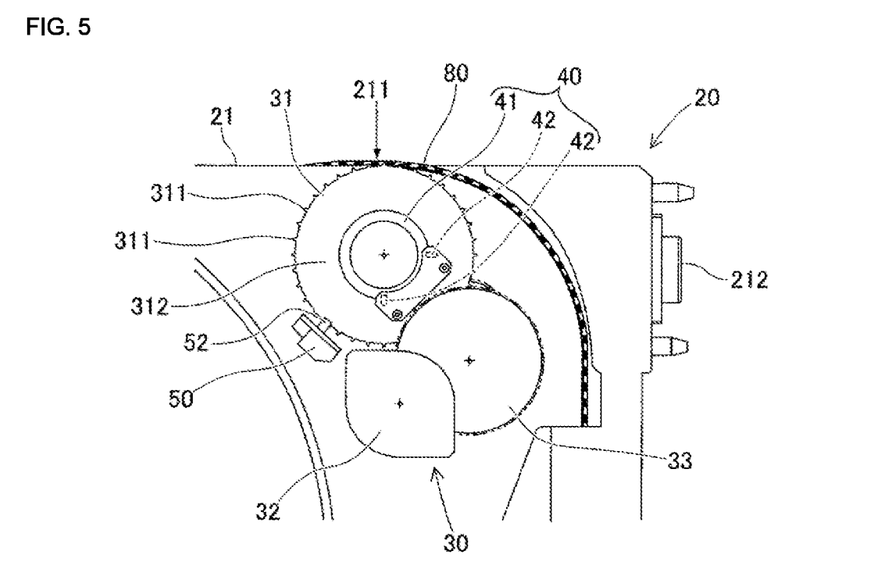
FIG. 5 A side view schematically showing a configuration, on the opposite side of the configuration shown in FIG. 4, of various sensors and detection sensors of the tape feeder.

Angle sensor 40 detects the angle of sprocket 31 with respect to feeder main body 21. In the present embodiment, as shown in FIG. 5, angle sensor 40 includes magnet body 41 and a pair of magnetic sensors 42. Magnet body 41 has a cylindrical shape and is magnetized so as to have two poles in the radial direction. Magnet body 41 is coaxial with respect to sprocket 31 and is provided so as to rotate together with sprocket 31.

Each of the pair of magnetic sensors 42 detects a magnetic field formed by magnet body 41 and outputs a sine wave detection signal. The pair of magnetic sensors 42 are provided on feeder main body 21 at a 90-degree interval along the circumferential direction of magnet body 41. As a result, the detection signals outputted from the pair of magnetic sensors 42 are phase-shifted by 90 degrees. Angle sensor 40 calculates the angle of sprocket 31, provided with magnet body 41, based on the detection signals from each of the pair of magnetic sensors 42.

Detection sensor 50 detects one of the multiple engagement protrusions 311 of sprocket 31. In the present embodiment, detection sensor 50 includes light-emitting section 51 and light-receiving section 52. As shown in FIGS. 4 and 5, light-emitting section 51 and light-receiving section 52 are disposed at diametrical positions of sprocket 31 on which engagement protrusions 311 are formed so as to oppose each other and sandwich engagement protrusion 311.

Detection sensor 50 receives light emitted from light-emitting section 51 with light-receiving section 52. Detection sensor 50 senses that one of the multiple engagement protrusions 311 is positioned between light-emitting section 51 and light-receiving section 52 when light-receiving state of light-receiving section 52 shifts to a light-blocked state.

Here, when the interval T1 of cavities 81 is set to an integer multiple of the interval T2 of engagement holes 82 (tapes 80B-80D in FIG. 3), and one of the multiple cavities 81 is positioned at supply section 211, engagement holes 82 are positioned at positions which are separated from supply section 211 by a distance of half of the interval T2 of engagement holes 82. Sprocket 31 is provided in feeder main body 21 so that engagement protrusion 311 positioned in a direction directly upward from the rotation center of sprocket 31 engages with engagement hole 82.

That is, detection sensor 50 is configured to detect one of the multiple engagement protrusions 311 at a predetermined position of feeder main body 21 when one of the multiple cavities 81 of tape 80 is positioned at supply section 211 of feeder 20 (i.e., a detection position deviated from the direction directly upward by 120 degrees in the circumferential direction in the present embodiment). Thus, detection sensor 50 is configured to detect engagement protrusion 311 at a predetermined position of feeder main body 21 when sprocket 31 is normally angled so as to position one of the multiple cavities 81 at supply section 211.

When the interval T1 of cavities 81 is set to half the interval T2 of engagement holes 82 (T1=T2/2) (tape 80A in FIG. 3), and multiple cavities 81 are sequentially positioned at supply section 211, sprocket 31 is angularly positioned at one angle at which one engagement protrusion 311 is directly upward and another angle at which an adjacent engagement protrusion 311 is rotated by half of the angle formed between the current angular position and the adjacent engagement protrusion 311. Therefore, detection sensor 50 detects engagement protrusion 311 at a predetermined position of feeder main body 21 at a rate of once every two times a cavity 81 is positioned at supply section 211.

In addition, detection sensor 50 may adopt other various other modes in addition to light-emitting section 51 and light-receiving section 52 facing each other. For example, detection sensor 50 may be arranged such that light-emitting section 51 and light receiving section 52 are arranged side by side on the side wall of feeder 20, detecting engagement protrusion 311 in a predetermined position by detecting the light reflected by engagement protrusion 311 or detecting when engagement protrusion 311 blocks the light reflected from the reflecting plate.

Control device 60 is powered from component mounting machine 10 via connector 212 when feeder 20 is set in upper slot 12 of component mounting machine 10. Control device 60 is in a state in which it can communicate with component mounting machine 10. Control device 60 controls the operation of driving device 30 based on control instructions or the like from component mounting machine 10. Specifically, control device 60 supplies pulse power to stepping motor 32 of driving device 30 and controls supply section 211 to sequentially position multiple cavities 81 of tape 80.

When the power of feeder 20 is turned on, control device 60 performs an origin alignment of sprocket 31. Since sprocket 31 is freely rotatable to some extent in the OFF state, in which feeder 20 is not powered on, the origin alignment is a process for determining the origin of control during the period in which feeder 20 is turned on. In the present embodiment, control device 60 supplies pulse power to stepping motor 32 to rotate sprocket 31 to a predetermined angle at which detection sensor 50 detects one of engagement protrusions 311. As a result, sprocket 31 is in a state in which sprocket 31 is angularly fixed such that an engagement protrusion 311 which is circumferentially deviated by 120 degrees from engagement protrusion 311 detected by detection sensor 50 is positioned in a direction directly upward from the rotation center of sprocket 31.

As shown in FIG. 2, control device 60 includes step-out detecting section 61, memory section 62, and restoration process section 63. Step-out detecting section 61 detects the step-out of stepping motor 32. Here, the step-out of stepping motor 32 refers to a state in which the actual rotation amount does not coincide, beyond a certain allowable range, with the rotation amount of sprocket 31 corresponding to the pulse power supplied to stepping motor 32. The step-out of stepping motor 32 may occur due to, for example, overloading of tape 80 or rotation failure of tape reel 70.

Here, control device 60 supplies pulse power to stepping motor 32 so as to position cavity 81 of tape 80 at supply section 211 when the conveyance of tape 80 is controlled so as to supply components in the mounting process by component mounting machine 10. In principle, in the operation of feeder 20 of the present embodiment, sprocket 31 is configured to stop when any of the multiple engagement protrusions 311 is positioned directly above the rotation center of sprocket 31. Thus, when sprocket 31 stops, detection sensor 50 detects engagement protrusion 311.

Therefore, step-out detecting section 61 determines whether stepping motor 32 has stepped out based on whether detection sensor 50 detects engagement protrusion 311 after control device 60 supplies a predetermined pulse power to stepping motor 32. Thus, when engagement protrusion 311 is not detected by detection sensor 50 despite the supply of predetermined pulse power to stepping motor 32, step-out detection section 61 determines that stepping motor 32 has stepped out on the assumption that the actual rotation amount is excessive or insufficient with respect to the rotation amount corresponding to the pulse power.

When the interval T1 between cavities 81 is set to half the interval T2 between engagement holes 82 (T1=T2/2) (tape 80A in FIG. 3), detection sensor 50 detects engagement protrusion 311 at a rate of once every two times a cavity 81 is positioned at supply section 211. Therefore, when tape 80A as described above is loaded in feeder 20, step-out detecting section 61 can determine whether a step-out of stepping motor 32 has occurred by determining whether detection sensor 50 alternates every time sprocket 31 stops.

Memory section 62 is configured by flash memory or the like. Memory section 62 stores various programs and calibration values used for controlling the operation of driving device 30 and angle information M1 relating to the angle of sprocket 31. Angle information M1 includes the target angle of sprocket 31 for positioning one of the multiple cavities 81 at supply section 211.

Here, feeder 20 may be loaded with tape 80 in which the interval T1 of the multiple cavities 81 is equal to the interval T2 of the multiple engagement holes 82 (tape 80B in FIG. 3), or tape 80 (tapes 80A, 80C, 80D in FIG. 3) in which the intervals T1 and T2 are different from each other. For example, when tape 80C is loaded with tape 80C in which the interval T1 between cavities 81 is twice the interval T2 between engagement holes 82, feeder 20 performs control such that sprocket 31 rotates by twice the angle between adjacent engagement protrusions 311 to sequentially position multiple cavities 81 at supply section 211.

In the above example, for half of the multiple engagement protrusions 311 positioned in the direction directly above the rotation center of sprocket 31, cavity 81 is positioned at supply section 211. On the other hand, none of multiple cavities 81 are positioned at supply section 211 for the other half of the multiple engagement protrusions 311 (tape 80B in FIG. 3) despite being positioned in the direction directly above the rotation center of sprocket 31. Whether sprocket 31 positions cavity 81 at supply section 211 at the reference angle (the angle detected as 0 degrees by angle sensor 40) (patterns 1, 2 in FIG. 6) is randomly determined when tape 80 is loaded into feeder 20.

Therefore, control device 60 acquires the target angle of sprocket 31 for positioning one of the multiple cavities 81 at supply section 211 and records the target angle in angle information M1. In the present embodiment, the "target angle of sprocket 31" is an angle of sprocket 31 detected by angle sensor 40 when one of the multiple cavities 81 is positioned at supply section 211 in a normal state, as shown in FIG. 6. Angle information M1 includes information indicating whether one of multiple cavities 81 is positioned at supply section 211 when each of the multiple engagement protrusions 311 of sprocket 31 engages with engagement holes 82 (patterns 1 and 2 indicated by "O" and "x" in FIG. 6).

That is, when tape 80 of the type shown in FIG. 6 is loaded on feeder 20 in pattern 1, the target angles of sprocket 31 are 0 degrees, 6 degrees, 12 degrees, 18 degrees, ... from the reference angle of sprocket 31. On the other hand, when the same type of tape 80 is loaded on feeder 20 in pattern 2, the target angles of sprocket 31 are 3 degrees, 9 degrees, 15 degrees, 21 degrees, ... from the reference angle of sprocket 31. In this manner, memory section 62 stores multiple periodic target angles for positioning cavity 81 at supply section 211 in accordance with the type of tape 80 loaded.

When step-out detecting section 61 detects the step-out of stepping motor 32, restoration process section 63 performs the above-mentioned origin alignment, supplies pulse power to stepping motor 32 in accordance with the current angle Ac of sprocket 31, after the origin alignment is completed, and the target angle stored in memory section 62, and moves one of the multiple cavities 81 to supply section 211. Restoration process section 63 executes the restoration process described above to attempt a restoration of feeder 20 so that component mounting machine 10 can pick up components from feeder 20.

Here, angle information M1 acquired in a normal state before a step-out is detected indicates the target angle by which sprocket 31 is to be rotated from the current angle Ac to position cavity 81 at supply section 211. Therefore, by using the target angle for the restoration process, it is possible to handle various types of tapes 80 having different intervals T1 between cavities 81. In the present embodiment, restoration process section 63 acquires, with angle sensor 40, the current angle Ac of sprocket 31 after the origin alignment is completed. Details of the restoration process will be described later.

In feeder 20 having such a configuration, when tape 80 is pitch-fed by operating driving device 30, cover tape 83 is peeled off before supply section 211, and the components are supplied to be picked up. Further, when step-out detecting section 61 detects the step-out of stepping motor 32 of driving device 30, feeder 20 executes the restoration process as appropriate and attempts the automatic restoration. It should be noted that the above-mentioned restoration process can also be executed when the step-out of stepping motor 32 is detected immediately after the power of feeder 20 is turned on.

1-3. Restoration Process Executed by Feeder 20

A process for restoring a step-out by feeder 20 will be described with reference to FIGS. 6 and 7. Here, it is assumed that feeder 20 is loaded with tape 80 (tape 80C in FIG. 5) in which the interval T1 between cavities 81 is twice the interval T2 between engagement holes 82. That is, the multiple cavities 81 of tape 80C are formed at intervals T1 different from the intervals T2 between the multiple engagement holes 82.

Feeder 20 sequentially positions the multiple cavities 81 at supply section 211 in the mounting process by component mounting machine 10. In this process, control device 60 supplies pulse power to stepping motor 32 so as to rotate sprocket 31 by twice the angle between adjacent engagement protrusions 311. Further, control device 60 records the target angle of sprocket 31 for positioning one of the multiple cavities 81 at supply section 211 in angle information M1 in a normal state before a step-out of stepping motor 32 is detected.

Specifically, as shown in FIG. 6, when angle sensor 40 detects an angle (0, 3, 6, 9, . . . ) of sprocket 31, control device 60 records information indicating whether cavity 81 is positioned at supply section 211 when engagement protrusion 311 (R1, R2, R3, R4, . . . ) engages with engagement holes 82 in the direction just above the rotation center of sprocket 31 (patterns 1 and 2 indicated by "O" and "X" in FIG. 6). Here, it is assumed that the loading state of tape 80 in feeder 20 is recognized as being in pattern 1 in a normal state.

During the execution of the mounting process by component mounting machine 10, step-out detecting section 61 of feeder 20 determines whether a step-out has occurred every time stepping motor 32 operates, for example. Here, it is assumed that a step-out of stepping motor 32 occurs due to some cause. Step-out detecting section 61 determines that the step-out of stepping motor 32 occurred based on the detection result of detection sensor 50 in which engagement protrusion 311 is not detected at a predetermined position (i.e., the detection position) of feeder main body 21.

Figure 7:
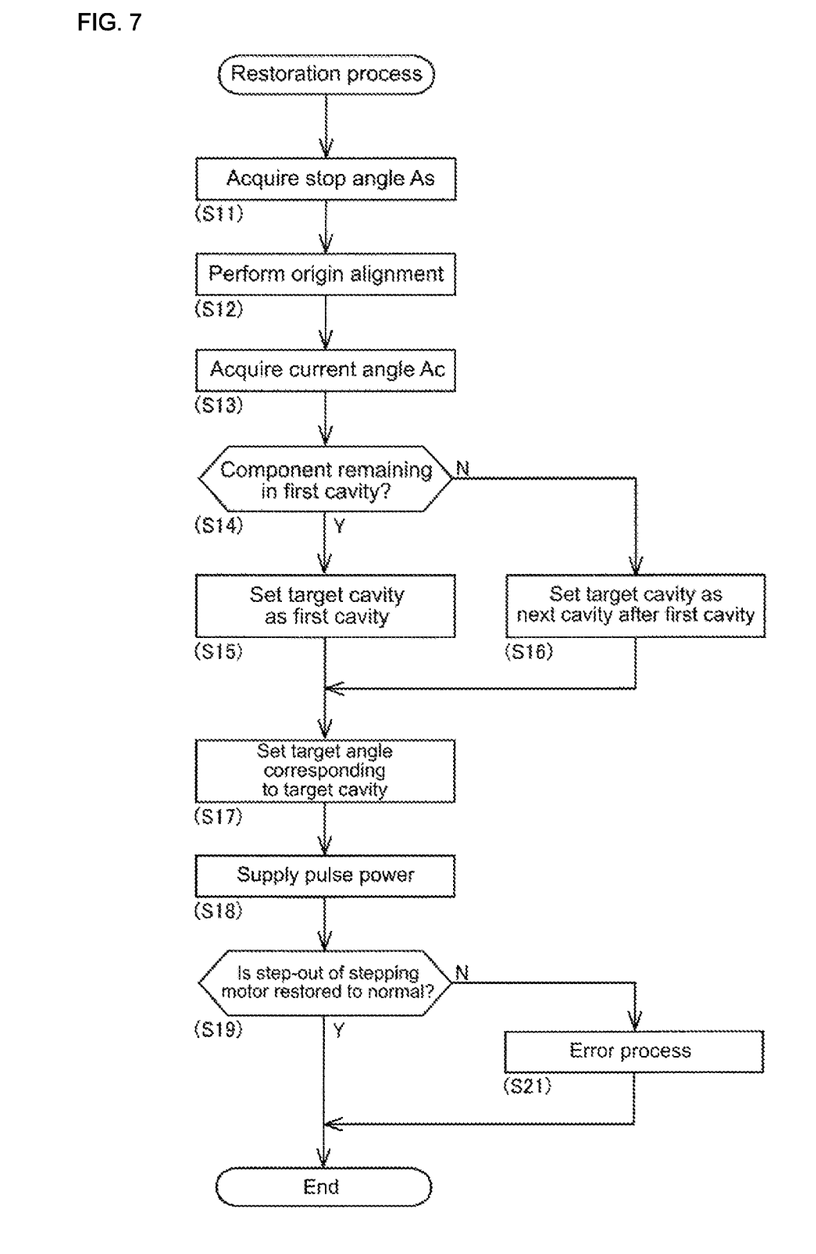
FIG. 7 A flowchart showing a restoration process.

When the step-out of stepping motor 32 is detected as described above, restoration process section 63 of control device 60 executes the restoration process shown in FIG. 7. First, restoration process section 63 acquires, with angle sensor 40, a stop angle As of sprocket 31 when a step-out occurs (Step 11 (hereinafter, "Step" is referred to as "S")). As a result, restoration process section 63 recognizes the stop angle As of sprocket 31 in accordance with the resolution of angle sensor 40.

Next, restoration process section 63 performs origin alignment of sprocket 31 (S12). Specifically, restoration process section 63 supplies pulse power to stepping motor 32 to rotate sprocket 31 until detection sensor 50 detects one of the engagement protrusions 311. Restoration process section 63 recognizes that the origin alignment is completed upon detecting engagement protrusion 311 with detection sensor 50. When the origin alignment is completed in a normal manner, control device 60 controls subsequent component supply processes using the current angle Ac of sprocket 31 as the origin for control.

It is assumed that an abnormality has occurred in which sprocket 31 does not rotate even if pulse power is supplied to stepping motor 32 when the origin alignment is not completed in a normal manner. In this instance, restoration process section 63 notifies component mounting machine 10 of an error and stops the restoration process. Restoration process section 63 acquires, from angle sensor 40, the current angle Ac of sprocket 31 after the origin alignment is completed (S13).

The step-out restoration process is a process of moving one of the multiple cavities 81 to supply section 211. However, mounting head 14 will fail to pick up a component after the restoration if a component is not accommodated in cavity 81 when cavity 81 that has not passed through supply section 211 is positioned at supply section 211. This is because, depending on the timing at which the step-out occurs, there are cases in which a component is successfully picked up by mounting head 14 from cavity 81 (defined as "first cavity 81A"), in which positioning to supply section 211 is attempted, immediately before the step-out of stepping motor 32 is detected.

That is, when first cavity 81A, corresponding to stepping motor 32 in which a step-out has occurred, reaches supply section 211, the component has been picked up by mounting head 14 and the component does not remain in first cavity 81A. On the other hand, for example, in the case where stepping motor 32 steps out immediately after an attempt to position first cavity 81A at supply section 211, picking up of the component by mounting head 14 fails, and the component remains in first cavity 81A.

Therefore, restoration process section 63 determines whether a component remains in first cavity 81A as described above (S14) and appropriately sets cavity 81 (defined as "target cavity 81T") to be positioned at supply section 211 in accordance with the result of the determination. In the above determination S14, restoration process section 63 may determine whether a component remains in first cavity 81A based on the stop angle As of sprocket 31.

Specifically, restoration process section 63 calculates the arrival angle of first cavity 81A to supply section 211 based on, for example, the stop angle As. When the arrival angle of first cavity 81A is smaller than a preset threshold, restoration process section 63 determines that a component was not supplied such that the component could be picked up from first cavity 81A and that the component remains in first cavity 81A (S14: Yes). On the other hand, when the arrival angle of first cavity 81A is equal to or larger than the threshold value, restoration process section 63 determines that a component was supplied such that the component could be picked up from first cavity 81A and that no component remains in first cavity 81A (S14: No).

In addition, in the above determination (S14), restoration process section 63 may acquire a pickup result indicating whether a component has been picked up from component mounting machine 10 that has attempted to pick up a component from first cavity 81A and determine whether a component remains in first cavity 81A based on the pickup result. Here, after the component is picked up by mounting head 14, component mounting machine 10 detects the presence and orientation of the picked up component by using, for example, a component camera (not shown). For this reason, supposing that a step-out occurs in stepping motor 32 and a component cannot be properly supplied from first cavity 81A, in the case that picking up a component fails, component mounting machine 10 can detect that a failure has occurred in picking up the component.

Therefore, restoration process section 63 acquires a pickup result indicating whether a component has been picked up from component mounting machine 10, for example, and determines that a component remains in first cavity 81A when the pickup result indicates that the pickup was unsuccessful (S14: Yes). On the other hand, when the pickup result indicates the pickup was successful, restoration process section 63 determines that no component remains in first cavity 81A (S14: No). Restoration process section 63 may employ a combined mode of using the stop angle As and a mode of using the pickup result as described above in determining whether a component remains in first cavity 81A (S14).

Next, when a component remains in first cavity 81A (S14: Yes), restoration process section 63 sets target cavity 81T as first cavity 81A (S15). On the other hand, when no component remains in first cavity 81A (S14: No), restoration process section 63 sets target cavity 81T to next cavity 81 after first cavity 81A (S16).

Restoration process section 63 sets the target angle of sprocket 31 when target cavity 81T set in step S15 or S16 is positioned at supply section 211 (S17). That is, restoration process section 63 sets the target angle of sprocket 31 corresponding to target cavity 81T based on angle information M1. Restoration process section 63 supplies stepping motor 32 with pulse power corresponding to the difference between the current angle Ac of sprocket 31 acquired, in S13, after the origin alignment is completed and the target angle of sprocket 31 set in step S17 (S18).

As a result, when a component remains in first cavity 81A (S14: Yes), restoration process section 63 moves first cavity 81A to supply section 211 (S18). On the other hand, when no component remains in first cavity 81A (S14: No), recovery process section 63 moves cavity 81 (in the present embodiment, cavity 81 next to first cavity 81A) after first cavity 81A to supply section 211 (S18).

When attempting to move target cavity 81T, which is one of the multiple cavities 81, to supply section 211 (S18), restoration process section 63 determines whether the operation of feeder 20 has been restored to normal (S19). Specifically, restoration process section 63 determines whether feeder 20 has been restored based on whether detection sensor 50 detects engagement protrusion 311.

In addition to or instead of the above determination, restoration process section 63 may acquire the current angle Ac of sprocket 31 again after supplying pulse power to stepping moto 32 (S18), and may determine whether the operation of feeder 20 has been restored to normal based on whether the current angle Ac matches the target angle of sprocket 31 set in S17. When feeder 20 is restored to normal (S19: Yes), restoration process section 63 ends the restoration process.

On the other hand, when the operation of feeder 20 is not restored to normal (S19: No), restoration process section 63 executes error processing such as notifying component mounting machine 10 that the component cannot be supplied by feeder 20 (S21). It is assumed that, when the above-described error notification (including the error notification in S12) is inputted, component mounting machine 10 notifies, for example, the operator to prompt the operator to exchange feeder 20 that has not been restored to normal, or controls an alternative feeder so that the alternative feeder supplies components.

2. Effects of the Embodiment Configuration

With the above-described feeder 20, the current angle Ac and the target angle after completion of the origin alignment are used in the step-out restoration process so that each of various types of tapes 80, having different intervals between cavities 81, can be handled. Feeder 20 can properly rotate sprocket 31 to convey tape 80, based on the current angle Ac and the target angle stored in advance in memory section 62, and restore component mounting machine 10 so that components can be picked up from supply section 211.

3. Modification of the Embodiment 3-1. Acquirement of Current Angle

In the embodiment, angle sensor 40 includes magnet body 41 and a pair of magnetic sensors 42. However, angle sensor 40 may adopt various other modes as long as the angle of sprocket 31 can be detected. Specifically, angle sensor 40 may be an encoder that calculates the angle based on a rotation amount received in the form of a pulse signal.

In the embodiment, angle sensor 40 is configured to directly detect the angle of sprocket 31. On the other hand, angle sensor 40 may indirectly detect the angle of sprocket 31. For example, angle sensor 40 may calculate the angle of sprocket 31 by detecting the angle of intermediate gear 34, which is another gear that rotates in conjunction with the rotation of sprocket 31.

In the embodiment, the "target angle of sprocket 31" recorded in angle information M1 is the angle of sprocket 31 detected by angle sensor 40 when one of the multiple cavities 81 is positioned at supply section 211 in a normal state. On the other hand, the "target angle of sprocket 31"

may be angle information sufficient to identify an engagement pattern that fluctuates in accordance with the relationship between the interval T1 between cavities 81 and the interval T2 between engagement holes 82.

Here, when the interval T1 of cavities 81 is N times the interval T2 of engagement holes 82 (T1=N·T2), the number of engagement patterns is indicated by N. When the number of patterns is 2 (N=2) as exemplified in the embodiment (N=2), if it is possible to distinguish whether the reference angle is odd-numbered engagement or even-numbered engagement from protrusions 311 positioned directly above the rotation center when sprocket 31 is at the reference angle, it is sufficient as information required for distinguishing the engagement patterns.

Therefore, instead of angle sensor 40, feeder 20 may be provided with an identification sensor capable of identifying the number of engagement protrusions 311 corresponding to the number of adjacent patterns. The identification sensor may detect, for example, a slit provided in sprocket 31 corresponding to odd-numbered engagement protrusions 311, from the reference angle, to identify whether two adjacent engagement protrusions 311 are odd-numbered or even-numbered. Memory section 62 stores, as a target angle, identification information of engagement protrusion 311 identified by the identification sensor when cavity 81 is positioned at supply section 211 in a normal state.

Then, when the step-out of stepping motor 32 is detected, restoration process section 63 acquires the current angle Ac of sprocket 31 after the origin alignment is completed on based on engagement protrusion 311 identified by the identification sensor, and supplies the pulse power corresponding to the current angle Ac and the target angle of sprocket 31 to the stepping motor. As a result, restoration process section 63 attempts to restore feeder 20. With such a configuration, the same effect as that of the embodiment can be obtained. In addition, compared with angle sensor 40, the configuration of feeder 20 can be simplified and the manufacturing cost can be reduced.

3-2. Step-Out Detection of Stepping Motor 32

In the embodiment, step-out detecting section 61 determines whether stepping motor 32 has stepped out based on whether detection sensor 50 has detected engagement protrusion 311. On the other hand, feeder 20 may detect the step-out of stepping motor 32 based on the detection result of another sensor or the like without using detection sensor 50, or may also detect the step-out of stepping motor 32 in a multimodal way by combining the detection result with the detection result of detection sensor 50 as appropriate.

Specifically, for example, feeder 20 may detect the step-out of stepping motor 32 based on the angle of sprocket 31 detected with angle sensor 40. That is, after control device 60 supplies a predetermined pulse power to stepping motor 32, step-out detecting section 61 detects the step-out based on whether the current angle Ac of sprocket 31 detected by angle sensor 40 is an excess or deficiency with respect to the target angle corresponding to the pulse power. With such a configuration, the same effect as that of the embodiment can be obtained.

3-3. Determination of Whether Component Remains in First Cavity 81A

In the embodiment, restoration process section 63 determines whether a component remains in first cavity 81A (S14). Whether a component remains in first cavity 81A is determined from the stop angle As of sprocket 31 when the step-out is detected or the pickup information indicating whether the component has been picked up from component mounting machine 10. Alternatively, restoration process section 63 may determine whether a component remains in first cavity 81A, for example, based on image data acquired by capturing an image of first cavity 81A with a camera provided in head moving device 15 in the same manner as mounting head 14.

In addition, restoration process section 63 may omit the above-described determination of whether a component remains in first cavity 81A and, if a step-out is detected, attempt a restoration so that sprocket 31 rotates from the current angle Ac by a predetermined angle or more. With such a configuration, it is wasteful if a component remains in first cavity 81A or a cavity after first cavity 81A for which positioning at supply section 211 has passed, but it is possible to reliably prevent a cavity in which a component does not remain from being positioned at supply section 211.

REFERENCE SIGNS LIST

10: Electronic component mounting machine, 20: Tape feeder, 21: Feeder body, 211: Supply section, 30: Driving section, 31: Sprocket, 311: Engagement protrusion, 32: Stepping motor, 40: Angle sensor, 50: Detection sensor, 60: Control section, 61: Step-out detection section, 62: Memory section, 63: Restoration process section, 80: Carrier tape, 81: Cavity, 82: Engagement hole, 90: Circuit board, T1, T2: Interval, M1: Angle information, As: Stop angle, Ac: Current angle

The invention claimed is:

1. A tape feeder configured to supply an electronic component to an electronic component mounting machine by conveying a carrier tape having multiple cavities for accommodating electronic components at a predetermined interval in the conveyance direction and multiple engagement holes at a predetermined interval in the conveyance direction; the tape feeder comprising:
   a feeder main body having a supply section configured to supply the electronic components to the electronic component mounting machine;
   a sprocket, being rotatably provided in the feeder main body, with multiple engagement protrusions that are arranged at equal intervals in a circumferential direction and are configured to engage with the engagement holes;
   a stepping motor configured to rotate the sprocket in accordance with supplied pulse power; and
   a control device configured to supply pulse power to the stepping motor to control the conveyance of the carrier tape so as to position the multiple cavities sequentially at the supply section; and
   wherein the control device includes:
      a step-out detecting section configured to detect a step-out of the stepping motor;
      a memory section configured to store a target angle of the sprocket for positioning one of the multiple cavities at the supply section, and
      a restoration process section configured to: perform origin alignment, when the step-out detecting section detects a step-out of the stepping motor, by supplying pulse power to the stepping motor so that the sprocket reaches a predetermined angle; supply pulse power to the stepping motor in accordance with the current angle and target angle of the sprocket after the origin alignment is completed, and move one of the multiple cavities to the supply section.

2. The tape feeder of claim 1, wherein the tape feeder further comprises an angle sensor configured to detect the current angle of the sprocket relative to the feeder body.

3. The tape feeder of claim 1, wherein multiple cavities are formed at intervals different from the intervals between the multiple engagement holes, and wherein the memory section stores information indicating whether one of the multiple cavities is positioned at the supply section when each of the multiple engagement protrusions of the sprocket is engaged with the engagement holes.

4. The tape feeder of claim 1, wherein, among the multiple cavities, a cavity is defined as a first cavity when the cavity is attempted for positioning to the supply section immediately before the step-out of the stepping motor is detected, and wherein the restoration process section moves the first cavity to the supply section when an electronic component remains in the first cavity, and moves the cavity after the first cavity to the supply section when an electronic component does not remain in the first cavity.

5. The tape feeder of claim 4, wherein the restoration process section determines whether the electronic component remains in the first cavity based on the current angle of the sprocket.

6. The tape feeder of claim 4, wherein the restoration process section acquires a pickup result indicating whether the electronic component has been picked up by the electronic component mounting machine that has attempted to pick up the electronic component from the first cavity, and determines whether the electronic component remains in the first cavity based on the pickup result.

7. The tape feeder claim 1, wherein the tape feeder further comprises a detection sensor configured to detect one of the engagement protrusions at a predetermined position of the feeder body when one of the multiple cavities is positioned at the supply section, and wherein the step-out detecting section determines whether the stepping motor has stepped out based on a detection result of the engagement protrusion by the detection sensor after the control device supplies a predetermined pulse power to the stepping motor.

8. The tape feeder of claim 7, wherein the restoration process section determines whether the step-out of the stepping motor has been restored based on the detection result of the engagement protrusion of the detection sensor when attempting to move one of the multiple cavities to the supply section.

\* \* \* \* \*